United States Patent
Yamanaka et al.

(10) Patent No.: US 7,315,213 B2
(45) Date of Patent: Jan. 1, 2008

(54) SEMICONDUCTOR DEVICE AND VOLTAGE-CONTROLLED OSCILLATION CIRCUIT

(75) Inventors: Hiroaki Yamanaka, Kawasaki (JP); Kunimitsu Kousaka, Kawasaki (JP); Kiyoshi Nishiwaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/355,076

(22) Filed: Feb. 16, 2006

(65) Prior Publication Data
US 2006/0132243 A1 Jun. 22, 2006

Related U.S. Application Data

(63) Continuation of application No. PCT/JP03/13297, filed on Oct. 17, 2003.

(51) Int. Cl.
*H03L 7/00* (2006.01)
(52) U.S. Cl. .............. 331/2; 331/49; 331/57
(58) Field of Classification Search .......... 331/2, 331/49, 57
See application file for complete search history.

(56) References Cited

U.S. PATENT DOCUMENTS

| | | | | |
|---|---|---|---|---|
| 5,490,182 A | * | 2/1996 | Arai | ............... 375/376 |
| 5,889,436 A | * | 3/1999 | Yeung et al. | ............... 331/2 |
| 6,333,652 B1 | | 12/2001 | Iida et al. | |
| 6,335,901 B1 | | 1/2002 | Morita et al. | |
| 6,781,470 B2 | * | 8/2004 | Rogerson | ............... 331/57 |

FOREIGN PATENT DOCUMENTS

| | | |
|---|---|---|
| JP | 05-343956 | 12/1993 |
| JP | 08-102643 | 4/1996 |
| JP | 2000-232356 | 8/2000 |
| JP | 2000-341099 | 12/2000 |
| JP | 2001-067870 | 3/2001 |

\* cited by examiner

*Primary Examiner*—Joseph Chang
(74) *Attorney, Agent, or Firm*—Arent Fox LLP

(57) ABSTRACT

A voltage-controlled oscillation circuit (15) includes a plurality of independent ring oscillation circuits different in the number of stages; and a selector (22) selectively outputting as a feedback clock signal (FB) an output of one of the ring oscillation circuits, so that any of the outputs of the independent ring oscillation circuits is always outputted as the feedback clock signal, which makes it possible to output the feedback clock signal keeping a proper duty ratio even when the operating speed is high, allowing arbitrary adjustment of the delay time before an input signal (DLLI) is outputted.

11 Claims, 10 Drawing Sheets

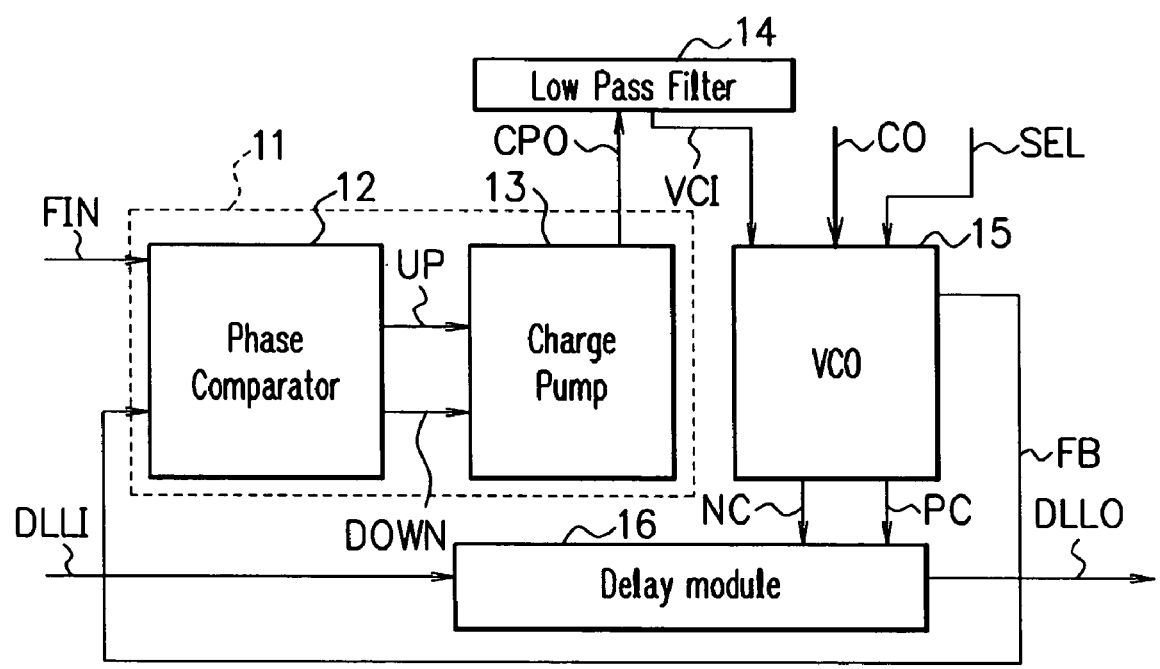
F I G. 1

F I G. 6A
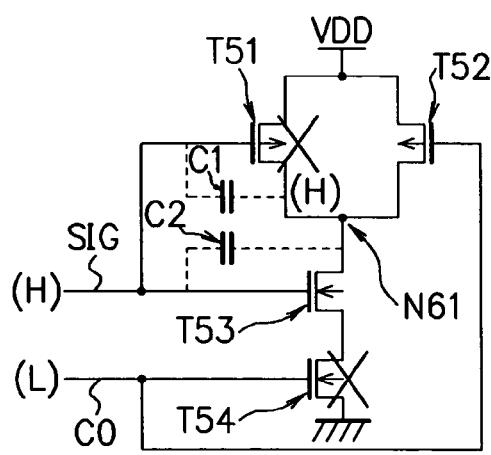
C=−Q
F I G. 6B
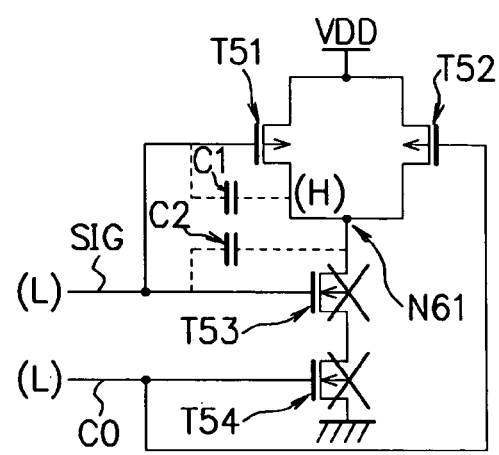
F I G. 6C
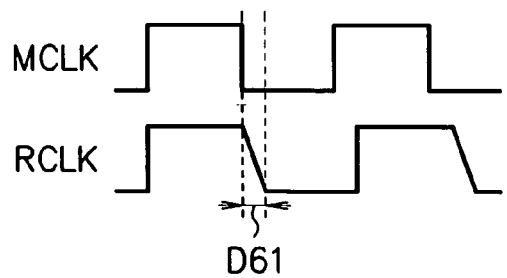

F I G. 9A
F I G. 9B
F I G. 9C
F I G. 9D

SEMICONDUCTOR DEVICE AND VOLTAGE-CONTROLLED OSCILLATION CIRCUIT

Transmitted herewith for filing under 37 C.F.R. § 1.53(b) is a continuation application of International Application No. PCT/JP03/13297; filed Oct. 17. 2003.

TECHNICAL FIELD

The present invention relates to a semiconductor device and a voltage-controlled oscillation circuit, and more particularly, is suitable for use as a DLL (Delay Locked Loop) circuit.

BACKGROUND ART

A DLL (Delay Locked Loop) circuit is used as an interface or the like of a memory, such as a DDR (Double Data Rate) memory, to/from which data is writable/readable in synchronization with a clock signal. The DLL circuit utilizes a PLL (Phase Locked Loop) function to adjust the delay time (output delay) before an inputted signal is outputted. Specifically, the DLL circuit compares an externally supplied reference clock signal and a clock signal generated in an internal voltage-controlled oscillation circuit to control the oscillation frequency of the clock signal, and adjusts the delay time by using a signal relating to this control.

However, a semiconductor device such as the DLL circuit generally has only one voltage-controlled oscillation circuit. Therefore, a range of the oscillation frequency of the clock signal internally generatable has been conventionally limited, and a range of the reference clock signal usable in the DLL circuit has been also limited.

One solution to such a problem was a voltage-controlled oscillation circuit which has a selector in a ring oscillation circuit (an inverter chain constituted of cascaded inverter circuits) included in the voltage-controlled oscillation circuit, thereby allowing the control for changing the number of stages (see, for example, Japanese Patent Application Laid-open No. Hei 5-343956 (Patent document 1)).

As a conventional voltage-controlled oscillation circuit, there is one structured such that a capacitor with one end thereof grounded is connectable to an output of an inverter circuit in a ring oscillation circuit as required to increase load capacitance at the output of the inverter circuit, thereby allowing the adjustment of the oscillation frequency (see, for example, Japanese Patent Application Laid-open No. Hei 8-102643 (Patent document 2)).

In the voltage-controlled oscillation circuit described in Japanese Patent Application Laid-open No. Hei 5-343956, however, the selector for controlling the number of stages is in a loop of the ring oscillation circuit. This has posed a problem that a duty ratio of the generated clock signal, which should be 5:5 as shown in FIG. 9A and FIG. 9B, may possibly become improper as shown in FIG. 9C and FIG. 9D. The improper duty ratio of the generated clock signal may possibly cause a great trouble under a high-speed operation as shown especially in FIG. 9D. If it is used in, for example, the DLL circuit, the adjustment of the delay time may possibly become unfeasible under the high-speed operation.

Further, the voltage-controlled oscillation circuit in which the capacitor with one end thereof grounded is connectable to the output of the inverter circuit in the ring oscillation circuit as required to thereby allow the adjustment of the oscillation frequency has problems, which will be described below with reference to FIG. 10A and FIG. 10B.

In FIG. 10A, an inverter circuit I101 connected to a power supply line Vdd and a ground line Vss inverts an input signal Vin inputted thereto to output it to an output node Va. Further, a capacitor C2 with one end thereof grounded is connected at the other end to an output of the inverter circuit I101, via a transistor T101 whose gate is supplied with a control signal VCont. The control signal VCont ON/OFF controls the transistor T101 to control the load capacitance at the output of the inverter circuit I101. Here, as shown in FIG. 10B, in the transistor T101, there exist parasitic capacitors Ca, Cb whose capacitances are basically large since these capacitors are bulk capacitors. In FIG. 10B, 102 denotes a drain, 103 a source, and 104 a gate.

Therefore, in the voltage-controlled oscillation circuit in which the capacitor with the one end thereof grounded is connectable to the output of the inverter circuit in the ring oscillation circuit as required, the bulk capacitance Ca is loaded on the output of the inverter circuit I101 when the transistor T101 is off, while the bulk capacitances Ca, Cb in addition to the capacitance C2 are loaded thereon when the transistor T101 is on. Since the bulk capacitors Ca, Cb are basically large in capacitance as described above, the control of a small oscillation frequency, namely, delicate adjustment of the delay time is not feasible.

Patent Document 1
Japanese Patent Application Laid-open No. Hei 5-343956
Patent Document 2
Japanese Patent Application Laid-open No. Hei 8-102643

SUMMARY OF THE INVENTION

The present invention was made in order to solve the above-described problems, and its object is to enable arbitrary adjustment of the delay time before an inputted signal is outputted, even when the operating speed is high. Another object is to enable high-accuracy adjustment of the delay time.

A semiconductor device of the present invention includes: a phase comparing circuit comparing phases of a reference clock signal and a feedback clock signal; and an oscillation circuit outputting the feedback clock signal and a delay control signal which controls the delay time based on a result of the comparison in the phase comparing circuit. The oscillation circuit includes: a plurality of independent internal oscillation circuits with different oscillation frequencies, the oscillation frequencies being controllable based on the result of the comparison in the phase comparing circuit; and a selecting circuit selectively outputting as the feedback clock signal one of outputs of the plural internal oscillation circuits.

According to the present invention, the internal oscillation circuits whose oscillation frequencies are controllable according to the result of the comparison in the phase comparing circuit are provided independently from one another, and the output of one of the internal oscillation circuits can be outputted as the feedback clock signal. This makes it possible to output the feedback clock signal keeping a proper duty ratio even when the operation speed is high, allowing arbitrary adjustment of the delay time before the inputted signal is outputted. Further, since the plural internal oscillation circuits with different oscillation frequencies are provided, reference clock signals with various frequencies are usable.

Each of the internal oscillation circuits may include a load capacitance circuit which is connected to output ends of logic gates with inverted outputs included in the internal oscillation circuit and whose load capacitance value is variable according to a control signal by utilizing oxide film capacitance of a MOS transistor as load capacitance. Providing the load capacitance circuit enables more delicate control of the delay time, allowing high-accuracy adjustment of the delay time.

Further, the voltage-controlled oscillation circuit of the present invention includes: a plurality of independent internal oscillation circuits with different oscillation frequencies; and a selecting circuit, wherein the oscillation frequencies of the internal oscillation circuits are controlled according to a voltage of an externally supplied voltage signal, and the selecting circuit selectively outputs an output of one of the internal oscillation circuits according to a selection signal relating to selection of the output. This makes it possible to output a clock signal with an arbitrary frequency keeping a proper duty ratio even when the operating rate is high.

BRIEF DESCRIPTION OF THE DRAWINGS

FIG. 1 is a block diagram showing a configuration example of a DLL circuit to which a semiconductor device according to an embodiment of the present invention is applied;

FIG. 6A to FIG. 6C are diagrams to illustrate a change in the load capacitance when a capacitance control signal has L;

FIG. 9A to FIG. 9D are charts to illustrate problems in a conventional voltage-controlled oscillation circuit.

DETAILED DESCRIPTION OF THE PREFERRED EMBODIMENTS

Figure 2:
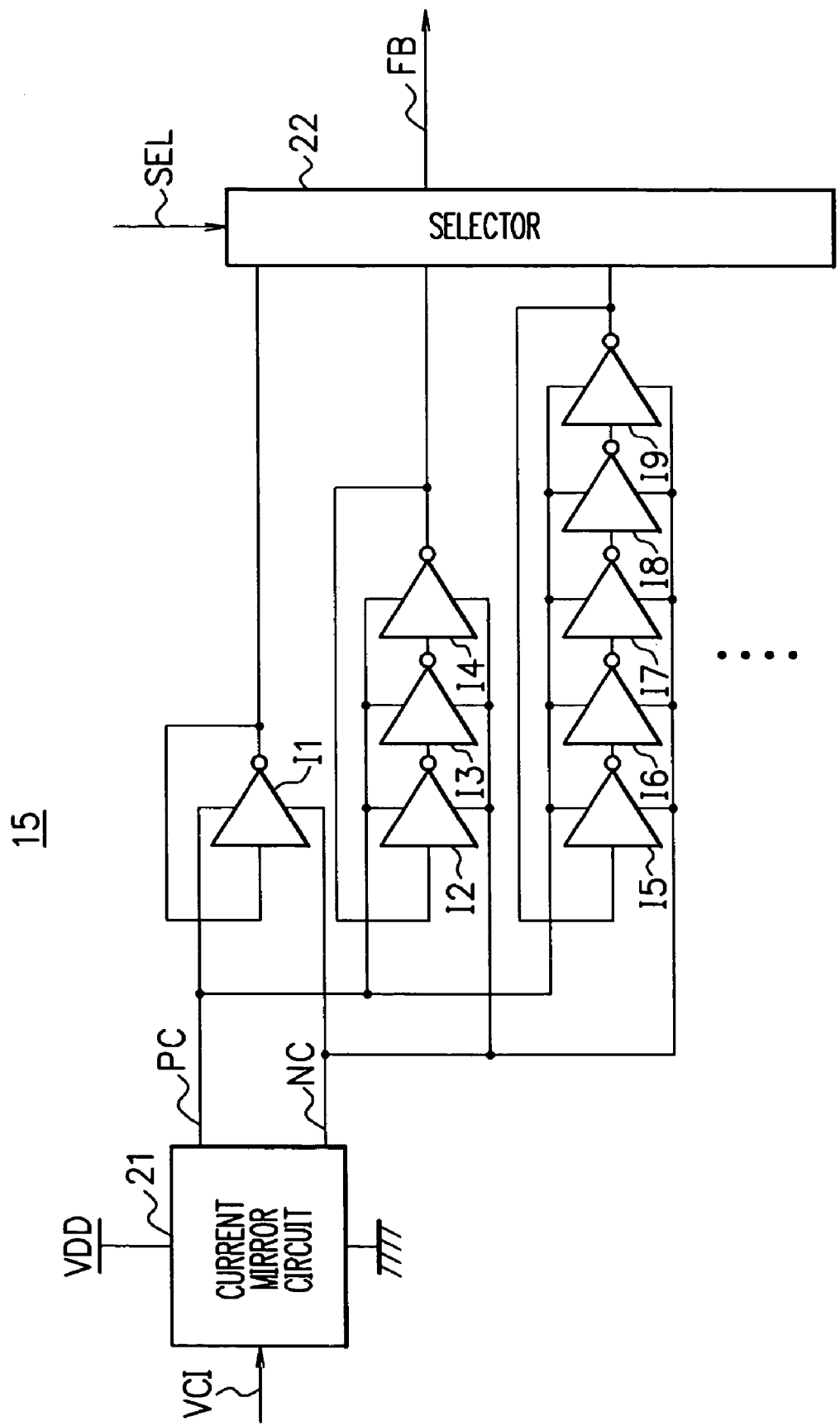
FIG. 2 is a block diagram showing a configuration example of a voltage-controlled oscillation circuit in this embodiment.

Hereinafter, embodiments of the present invention will be described based on the drawings.

FIG. 1 is a block diagram showing a configuration example of a DLL (delay locked loop) circuit to which a semiconductor device according to an embodiment of the present invention is applied. The DLL circuit in this embodiment includes a phase comparing circuit 11, a filter circuit (Low Pass Filter) 14, a voltage-controlled oscillation circuit (VCO) 15, and a delay circuit (Delay module) 16.

To the phase comparing circuit 11, a reference clock signal FIN and a delay clock signal FB which is a feedback clock signal are inputted. Here, the reference clock signal FIN is an externally supplied signal, while the delay clock signal FB is a signal supplied from the voltage-controlled oscillation circuit 15. The phase comparing circuit 11 compares phases of these two clock signals FIN and FB to output a voltage signal CPO to the filter circuit 14 according to the comparison result.

Specifically, the phase comparing circuit 11 has a phase comparator 12 and a charge pump 13. The phase comparator 12 receives the reference clock signal FIN and the delay clock signal FB to compare the phases of the inputted clock signals FIN and FB. The phase comparator 12 further outputs an up signal UP and a down signal DOWN to the charge pump 13 according to the comparison result. The charge pump 13 changes an output voltage of the voltage signal CPO according to the up signal UP and the down signal DOWN to output it.

The filter circuit 14 applies filtering to the inputted voltage signal CPO to output the resultant filter output as a voltage signal VCI to the voltage-controlled oscillation circuit 15. The filter circuit 14 is generally constituted of a low pass filter.

The voltage-controlled oscillation circuit 15 outputs the delay clock signal FB having an oscillation frequency according to a voltage of the inputted voltage signal VCI, namely, according to the comparison result in the phase comparing circuit 11, and it also outputs delay control signals PC, NC according to the voltage of the voltage signal VCI. To the voltage-controlled oscillation circuit 15, a selection signal SEL and a capacitance control signal CO are further inputted. The voltage-controlled oscillation circuit 15 will be described later in detail.

To the delay circuit 16, an input signal DLLI is externally inputted as well as the delay control signals PC, NC are inputted from the voltage-controlled oscillation circuit 15. After delaying the input signal DLLI by a predetermined time according to the delay control signals PC, NC, the delay circuit 16 outputs it as an output signal DLLO. The delay circuit 16 will be described later in detail.

FIG. 2 is a block diagram showing a configuration example of the voltage-controlled oscillation circuit 15.

The voltage-controlled oscillation circuit 15 includes: one current mirror circuit 21; a plurality of ring oscillation circuits constituted of inverter circuits I1, I2, I3, . . . ; and one selector 22.

Figure 3A:
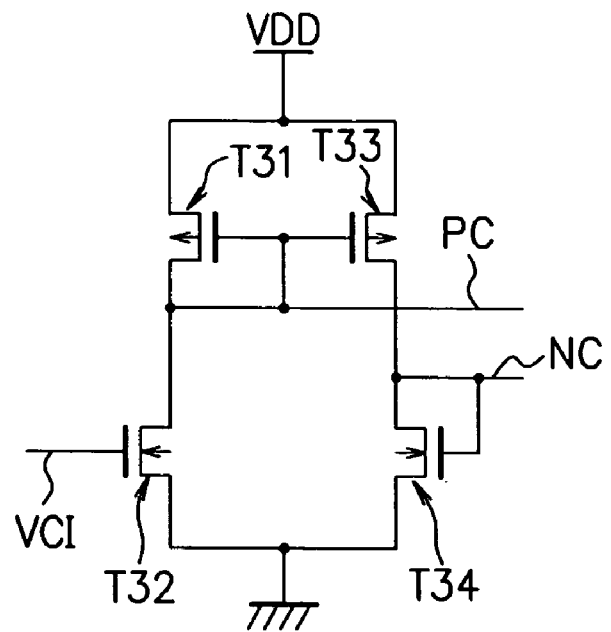
FIG. 3A is a diagram showing a circuit configuration of a current mirror circuit.

The current mirror circuit 21 receives the voltage signal VCI to output the delay control signals PC, NC having voltages according to the voltage signal VCI, and is configured, for example, as shown in FIG. 3A. The delay control signals PC, NC are signals supplied to the inverter circuits I1, I2, I3, . . . as well as supplied to the delay circuit 16 shown in FIG. 1.

FIG. 3A is a diagram showing a circuit configuration of the current mirror circuit 21. In FIG. 3A, T31 and T33 are P-channel MOS transistors, and T32 and T34 are N-channel MOS transistors. Sources of the transistors T31, T33 are connected to a power source VDD, and sources of the transistors T32, T34 are connected to ground level (grounded). The voltage signal VCI is supplied to a gate of the transistor T32.

A drain of the transistor T31 is connected to a drain of the transistor T32, and gates of the transistors T31, T33 are connected to a junction of the drains of the transistors T31 and T32. Further, an output signal line of the delay control signal PC is connected to the junction of the drains of the transistors T31 and T32.

Similarly, a drain of the transistor T33 is connected to a drain of the transistor T34, and a gate of the transistor T34 is connected to a junction of the drains of the transistors T33 and T34. Further, an output signal line of the delay control signal NC is connected to the junction of the drains of the transistors T33 and T34.

Returning to FIG. 2, the plural ring oscillation circuits included in the voltage-controlled oscillation circuit 15 are different in the number of stages, and are independent from one another. As shown in FIG. 2, the one inverter circuit I1 constitutes one-stage ring oscillation circuit by feeding an output back to its input, and the three cascaded inverter circuits I2, I3, I4 constitute a three-stage ring oscillation circuit by feeding an output of the final-stage inverter circuit I4 back to an input of the first-stage inverter circuit I2.

Similarly, the five cascaded inverter circuits I5, I6, I7, I8, I9 constitute a five-stage ring oscillation circuit by feeding an output of the final-stage inverter circuit I9 back to an input of the first-stage inverter circuit I5.

In short, in the voltage-controlled oscillation circuit 15, an output of the final-stage inverter circuit is fed back to the first-stage inverter circuit in each inverter chain in which (2m−1) pieces (a value m is a natural number, and is different depending on each of the ring oscillation circuits) of the inverter circuits, namely, an odd number of inverter circuits are cascaded, so that the ring oscillation circuits different in the number of stages are constituted.

Here, each of the inverter circuits I1, I2, I3, . . . constituting the ring oscillation circuits is supplied with the delay control signals PC, NC.

Figure 3B:
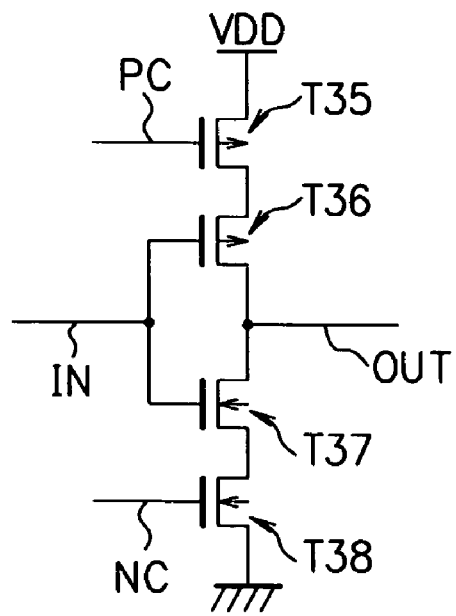
FIG. 3B is a diagram showing a circuit configuration of an inverter circuit.

FIG. 3B is a diagram showing a circuit configuration of the inverter circuit constituting the ring oscillation circuit. In FIG. 3B, T35 and T36 are P-channel MOS transistors, and T37 and T38 are N-channel MOS transistors.

A source of the transistor T35 is connected to a power source VDD, and a drain thereof is connected to a source of the transistor T36. A source of the transistor T38 is connected to ground level (grounded) and a drain thereof is connected to a source of the transistor T37. A drain of the transistor T36 and a drain of the transistor T37 are connected to each other, and a junction thereof is an output node OUT.

Further, the delay control signal PC is supplied to a gate of the transistor T35, and the delay control signal NC is supplied to a gate of the transistor T38. An input signal IN is supplied to gates of the transistors T36, T37.

When the inverter circuits I1, I2, I3, . . . are configured as described above, the transistors T35, T38 operate as variable resistors controlled by the delay control signals PC, NC, so that current amounts in the transistors T35, T38 are controlled according to the voltages of the delay control signals PC, NC. Accordingly, voltages applied to the transistors T36, T37 change, which in turn changes the delay time of the inverter circuit. In other words, the delay time of the inverter circuit is controlled by the voltages of the delay control signals PC, NC. This makes it possible to control oscillation frequencies of the ring oscillation circuits according to the delay control signals PC, NC based on the voltage signal VCI indicating the comparison result in the phase comparing circuit 11.

The selector (selecting circuit) 22 receives outputs of the final-stage inverter circuits I1, I4, I9 in the ring oscillation circuits, namely, oscillation outputs of the plural independent ring oscillation circuits. According to the externally supplied selection signal SEL the selector 22 selects one of the inputted oscillation outputs to selectively output it as the delay clock signal FB.

It should be noted that, though FIG. 2 shows the ring oscillation circuits with one stage, three stages, and five stages as an example, this is not restrictive, and the voltage-controlled oscillation circuit 15 may further include a ring oscillation circuit with an arbitrary odd number of stages (for example, seven stages, nine stages . . . ).

Figure 4:
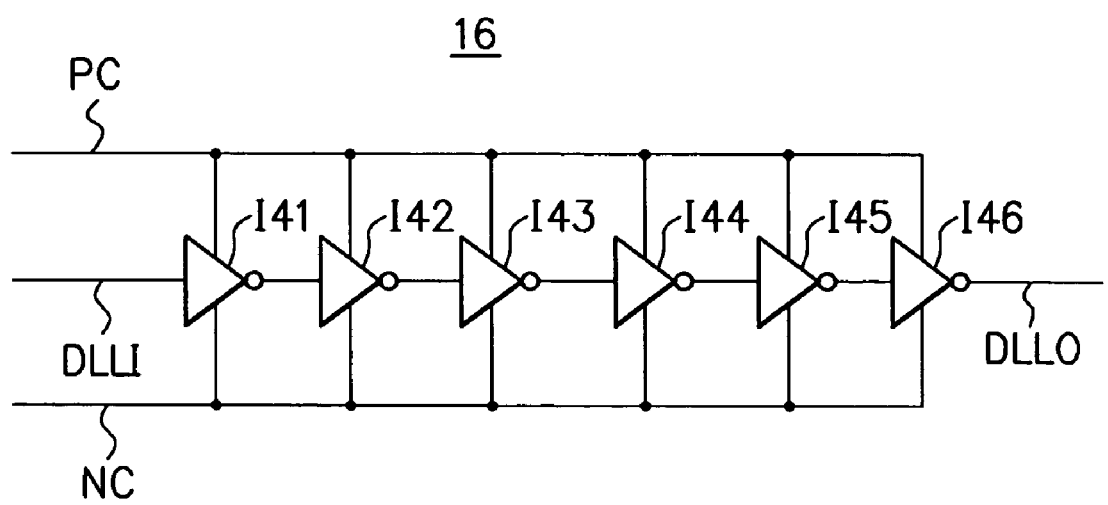
FIG. 4 is a diagram showing a configuration example of a delay circuit.

FIG. 4 is a block diagram showing a configuration example of the delay circuit 16.

The delay circuit 16 is constituted of an even number of cascaded inverter circuits I41 to I46 (inverter chain).

The delay circuit 16 is supplied with the input signal DLLI as an input to the first-stage inverter circuit I41, and an output thereof is supplied as an input to the subsequent-stage inverter circuit I42. Thereafter, an output of each of the inverter circuits is supplied to an input to a subsequent-stage inverter. Then, an output of the final-stage inverter circuit I46 is outputted as the output signal DLLO.

Further, each of the inverter circuits I41 to I46 is supplied with the delay control signals PC, NC and is configured similarly to the inverter circuit shown in FIG. 3B. Therefore, controlling the delay time of each of the inverter circuits I41 to I46 by the voltages of the delay control signals PC, NC makes it possible to control the delay time of the whole delay circuit 16.

Next, operations will be described.

First, the phase comparator 12 in the phase comparing circuit 11 compares the phases of the inputted reference clock signal FIN and delay clock signal FB to supply the comparison result to the charge pump 13 by the up signal UP and the down signal DOWN. The charge pump 13 changes the output voltage of the voltage signal CPO according to the up signal UP and the down signal DOWN. Incidentally, when the result of the comparison of the phases of the clock signals FIN and FB by the phase comparator 12 shows that they match each other, neither the up signal UP nor the down signal DOWN is outputted (activated), so that the output voltage of the voltage CPO outputted from the charge pump 13 does not change.

Next, the filter circuit 14 applies the filtering to the voltage signal CPO to output it as the voltage signal VCI to the voltage-controlled oscillation circuit 15. The current mirror circuit 21 in the voltage-controlled oscillation circuit 15 generates the delay control signals PC, NC according to the voltage of the voltage signal VCI to supply them to the inverter circuits I1, I2, I3, . . . constituting the ring oscillation circuits and to the delay circuit 16.

Consequently, the oscillation signals with the oscillation frequencies according to the delay control signals PC, NC are outputted from the plural ring oscillation circuits in the voltage-controlled oscillation circuit 15, respectively. The selector 22 selects one of the oscillation signals outputted from the plural ring oscillation circuits, according to the selection signal SEL to output the selected oscillation signal as the delay clock signal FB.

By repeating the above-described operations, the delay clock signal FB matching the reference clock signal FIN is obtained. Specifically, when the reference clock signal FIN and the delay clock signal FB do not match each other, the voltage signal VCI changes according to a difference between the reference clock signal FIN and the delay clock signal FB, which accordingly changes the delay control signals PC, NC. As a result, the delay times of the inverter circuits I1, I2, I3, . . . constituting the plural ring oscillation circuits change, so that the oscillation frequency of the oscillation signal outputted as the delay clock signal FB changes so as to reduce the difference.

On the other hand, when the reference clock signal FIN and the delay clock signal FB match each other, no change occurs in the voltage signal VCI and the delay control signals PC, NC. Therefore, the delay times of the inverter circuits I1, I2, I3, constituting the plural ring oscillation circuits do not change, so that the delay clock signal FB matching the reference clock signal FIN is outputted.

Further, in the DLL circuit in this embodiment, the selector 22 is capable of selectively outputting one of the oscillation signals outputted from the plural independent ring oscillation circuits which are different in the number of stages. Therefore, even when a high-speed operation is required, it is possible to control the number of stages of the ring oscillation circuit (inverter chain) by the selector 22 to adjust the lock timing in the phase comparing circuit 11. Moreover, a lockable frequency range of the reference clock signal is widened.

Here, the delay time in the delay circuit 16 is controlled by the delay control signals PC, NC similarly to those in the plural ring oscillation circuits in the voltage-controlled oscillation circuit 15. Therefore, controlling the number of stages of the ring oscillation circuit (inverter chain) to adjust the lock timing in the phase comparing circuit 11 makes it possible to control the delay time of the whole delay circuit 16.

Figure 5A:
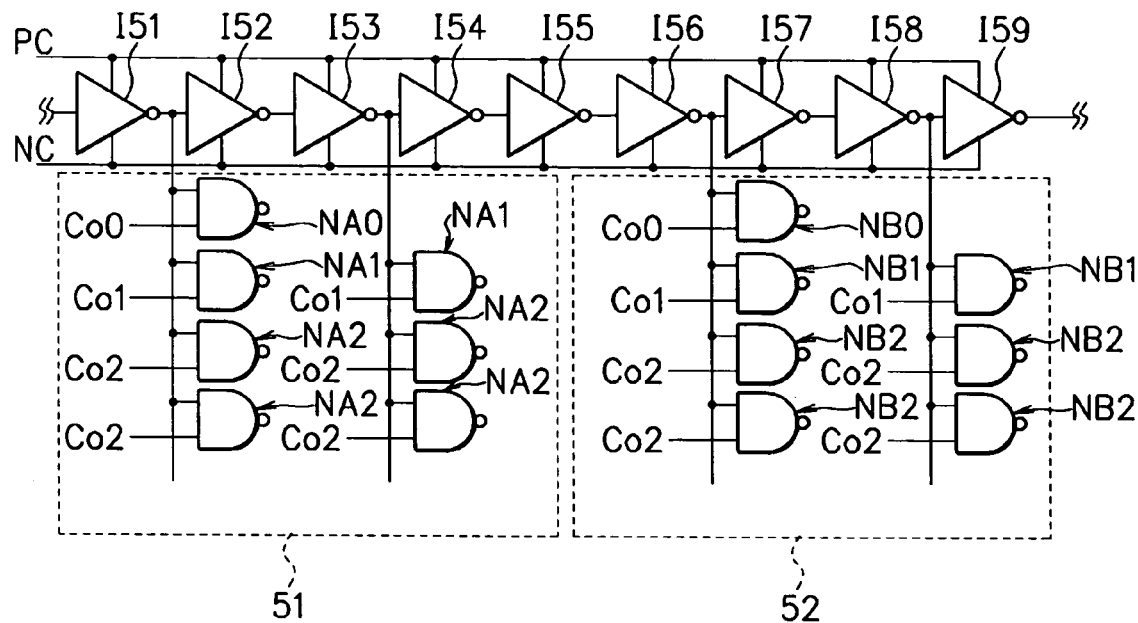
FIG. 5A is a diagram showing a circuit configuration example when a delay time is controlled by load capacitance.

In addition, providing load capacitance circuits 51, 52 for the plural ring oscillation circuits (inverter chains) in the voltage-controlled oscillation circuit 15 as shown in FIG. 5A makes it possible to more delicately adjust the lock timing in the phase comparing circuit 11, namely, the delay time of the whole delay circuit 16.

FIG. 5A is a diagram showing a circuit configuration when the delay time of an inverter chain constituting a ring oscillation circuit is controlled by load capacitance.

In FIG. 5A, each of inverter circuits I51 to I59 is supplied with the delay control signals PC, NC and is constituted similarly to the inverter circuit shown in FIG. 3B. The inverter circuits I51 to I59 are cascaded.

51 and 52 denote the load capacitance circuits. The load capacitance circuit 51 is constituted of a plurality of logic gates (NAND circuits) NA0, NA1, NA2, ... whose outputs are open. One-side inputs of the NAND circuits NA0, NA1, NA2, ... are supplied with capacitance control signals Co0, Co1, Co2, ..., and the other inputs thereof are connected to junctions of output ends of odd-numbered inverter circuits (the inverter circuits I51, I53 in FIG. 5A) in the inverter chain and input ends of their subsequent inverter circuits.

Here, the load capacitance circuit 51 has one (=$2^0$) piece of the NAND circuit NA0 supplied with the capacitance control signal Co0, two (=$2^1$) pieces of the NAND circuits NA1 each supplied with the capacitance control signal Co1, and four (=$2^2$) pieces of the NAND circuits NA2 each supplied with the capacitance control signal Co2. Therefore, for changing the delay time by the load capacitance circuit 51, linear change is possible by binary control.

The load capacitance circuit 52 is the same as the load capacitance circuit 51 except in that the other inputs of the plural NAND circuits NB0, NB1, NB2, ... are connected to junctions of output ends of even-numbered inverter circuits (the inverter circuits I56, I58 in FIG. 5A) in the inverter chain and input ends of their subsequent-stage inverter circuits, and therefore, description thereof will not be given.

Figure 5B:
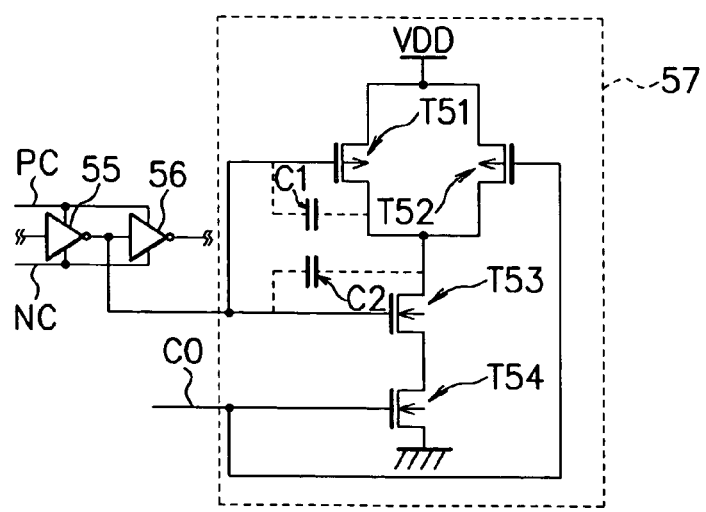
FIG. 5B is a diagram showing a configuration of a NAND circuit as the load capacitance.

FIG. 5B is a diagram schematically showing a configuration of the NAND circuit included in the load capacitance circuits 51, 52.

In FIG. 5B, 55 and 56 are inverter circuits configured similarly to the inverter circuit shown in FIG. 3B. 57 is a NAND circuit, which is constituted of two P-channel transistors T51, T52 and two N-channel transistors T53, T54.

Sources of the transistors T51, T52 are connected to a power source VDD, and drains thereof are commonly connected to a drain of the transistor T53. A source of the transistor T53 is connected to a drain of the transistor T54, and a source of the transistor T54 is connected to ground level (grounded). Further, gates of the transistors T51, T53 are connected to a junction of an output end of the inverter circuit 55 and an input end of the inverter circuit 56, and gates of the transistors T52, T54 are supplied with the capacitance control signal CO.

Further, C1, C2 are oxide film capacitors formed between gates and drains in the transistors T51, T53. In the load capacitance circuit in this embodiment, the oxide film capacitors C1, C2 are used to control load capacitance. This allows delicate capacitance control compared with conventional control of load capacitance using a bulk capacitor (parasitic capacitor).

Next, principles will be described with reference to FIG. 6A to FIG. 6C and FIG. 7A to FIG. 7C.

Note that the signal SIG in FIG. 6A, FIG. 6B, FIG. 7A, and FIG. 7B is a signal supplied from the inverter circuit (ring oscillation circuit).

FIG. 6A and FIG. 6B are diagrams to illustrate a change in the load capacitance when the capacitance control signal CO has low level (L).

When the capacitance control signal CO has L as well as the signal SIG has high level (H), the transistors T52, T53 turn on and the transistors T51, T54 turn off as shown in FIG. 6A. At this time, the level of a node N61 is H.

On the other hand, when the capacitance control signal CO has L as well as the signal SIG has L, the transistors T51, T52 turn on and the transistors T53, T54 turn off as shown in FIG. 6B. At this time, the level of the node N61 is H.

Here, suppose Q=CV, and V=1 (V) for further simplifying the description. When the signal SIG changes from H to L while the capacitance control signal CO has L, a potential difference occurs between both ends of the capacitors C1, C2 to give load to the inverter circuit (C=−Q). On the other hand, when the signal SIG changes from L to H, no potential difference occurs between the both ends of the capacitors C1, C2, so that no load is given.

Therefore, when the capacitance control signal CO has L, a clock signal RCLK is delayed by a delay time D61 only when it changes from H to L, namely, when it falls, as shown in FIG. 6C. Note that MCLK in FIG. 6C is a clock signal when an ideal state is assumed (supposing that there is nothing influencing the signal), and RCLK is a clock signal when the NAND circuit is provided as the load capacitance circuit.

Figure 7A:
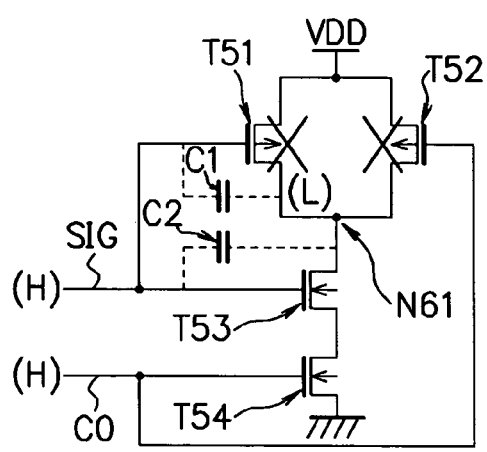
FIG. 7A to FIG. 7C are diagrams to illustrate a change in the load capacitance when the capacitance control signal has H.
Figure 7B:
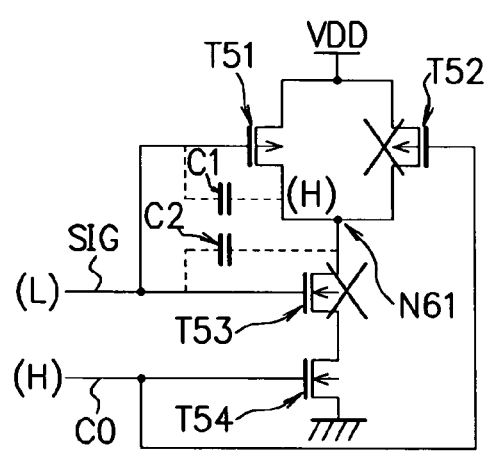

FIG. 7A and FIG. 7B are diagrams to illustrate a change in the load capacitance when the capacitance control signal CO has H.

When the capacitance control signal CO has H as well as the signal SIG has H, the transistors T53, T54 turn on and the transistors T51, T52 turn off as shown in FIG. 7A. At this time, the level of the node 61 is L.

On the other hand, when the capacitance control signal CO has H as well as the signal SIG has L, the transistors T51, T54 turn on and the transistors T52, T53 turn off as shown in FIG. 7B. At this time, the level of the node N61 is H.

Similarly to the above-described operations in FIG. 6A to FIG. 6C, when the signal SIG changes from H to L while the capacitance control signal CO has H, a potential difference occurs between the both ends of the capacitors C1, C2 to give load to the inverter circuit (C=−Q). Further, when the signal SIG changes from L to H, the potential difference also occurs between the both ends of the capacitors C1, C2 to give load (C=+Q).

Figure 7C:
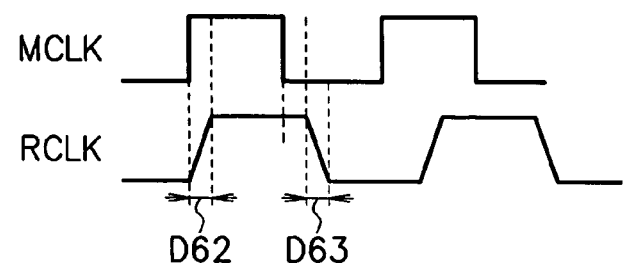

Therefore, as shown in FIG. 7C, when the capacitance control signal CO has H, the clock signal RCLK is delayed by a delay time D62 when it changes from H to L (falling time) and is delayed by a delay time D63 when it changes from L to H (rising time).

Further, as is apparent from the description hitherto, when the capacitance control signal CO has L, the delay is given only to one-side edge (falling time), and when the capacitance control signal CO has H, the delay is given to both edges (falling time and rising time). In order to solve this disadvantage, this embodiment provides the two load capacitance circuits 51, 52, and one load capacitance circuit 51 and one load capacitance circuit 52 are provided for nodes where outputs of the inverter circuits are in reverse phases at the same instant, namely, for the outputs of the odd-numbered inverter circuits and the even-numbered inverter circuits. This makes it possible to give equal delays to the both edges.

The load capacitance circuits 51, 52 shown in FIG. 5A are provided for each of the plural ring oscillation circuits included in the voltage-controlled oscillation circuit 15, and the load capacitance in each of the ring oscillation circuits is controlled by the capacitance control signal CO, which enables delicate adjustment of the lock timing in the phase comparing circuit 11, allowing more delicate adjustment of the delay time of the whole delay circuit 16.

For example, each segment between values DT1, DT2, DT3, . . . of the delay time, which is controllable by controlling the number of stages of the ring oscillation circuit (inverter chain) by the selector 22, is equally divided, and equally spaced delay time values obtained by the division are made controllable by the capacitance control of the load capacitance circuits 51, 52 based on the capacitance control signal CO, whereby linear adjustment of the lock timing in the phase comparing circuit 11 is made possible.

Figure 8:
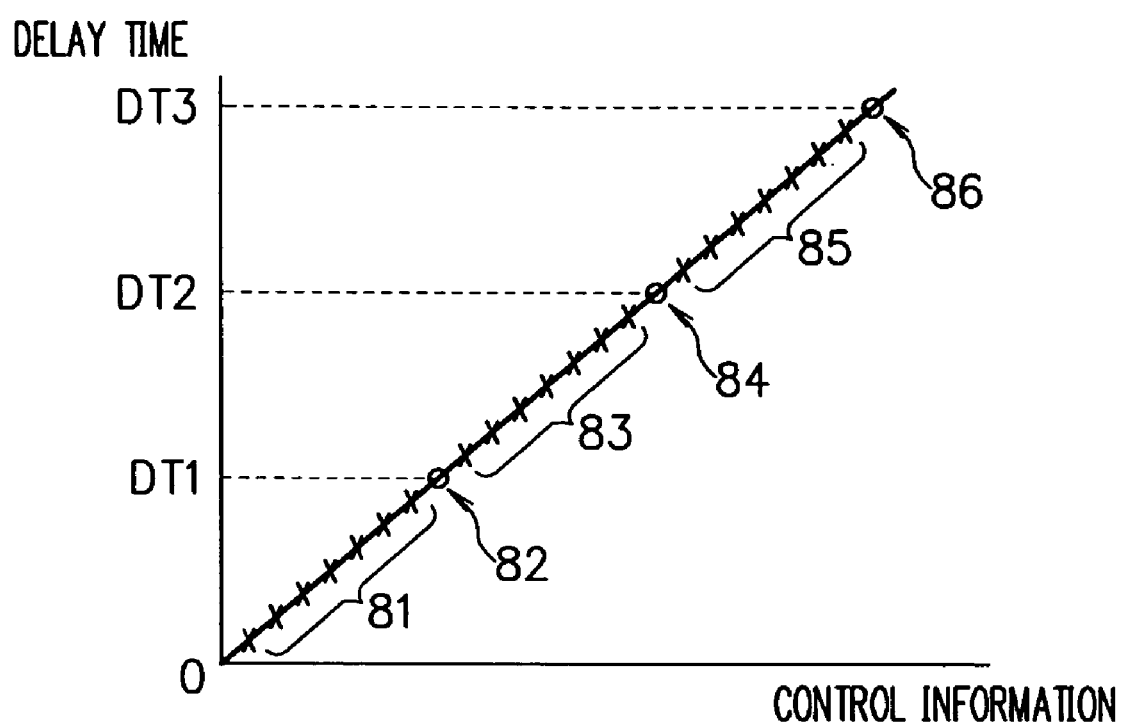
FIG. 8 is a chart showing an example of delay time control in this embodiment.
Figure 10A:
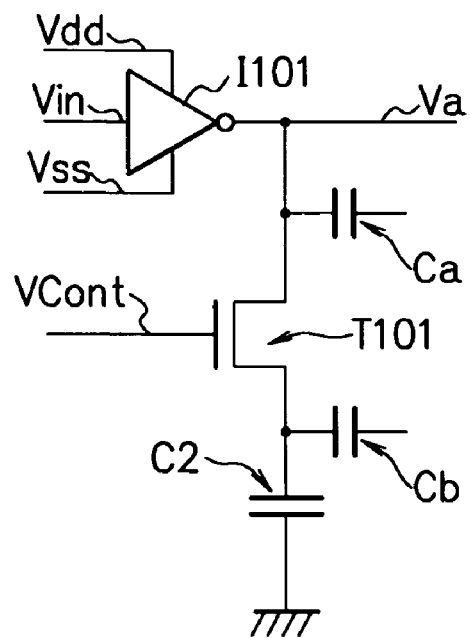
FIG. 10A and FIG. 10B are diagrams showing a conventional circuit controlling the delay time using capacitors.
Figure 10B:
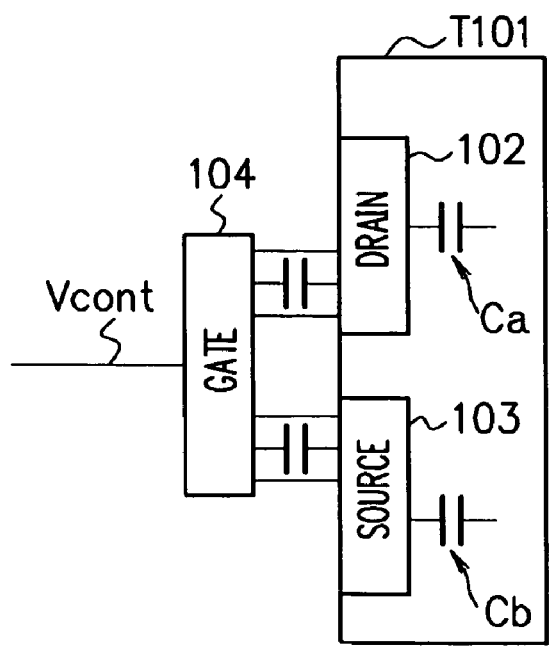

For example, as shown in FIG. 8, in order to set the delay time to DT1, DT2, and DT3, the delay time is controlled only by the control of the number of stages by the selector 22, namely, only by the control based on the selection signal SEL, and in order to set the delay time to any value in the segments between the delay times DT1, DT2, DT3, the delay time can be controlled by the binary control of the capacitance based on the capacitance control signal CO in addition to the control of the number of stages by the selector 22. Note that the vertical axis and the horizontal axis in FIG. 8 show the delay time and control information (control value) respectively.

According to this embodiment described hitherto, the plural independent ring oscillation circuits different in the number of stages are provided in the voltage-controlled oscillation circuit 15, and the output of one of the ring oscillation circuits is selectively outputted as the feedback clock signal FB by the selector 22 according to the selection signal SEL. Consequently, any one of the outputs of the independent ring oscillation circuits is always outputted as the feedback clock signal, which makes it possible to output the feedback clock signal keeping the proper duty ratio even when the operating speed is high, allowing arbitrary adjustment of the delay time before the input signal DLLI is outputted as the output signal DLLO.

Further, the plural independent ring oscillation circuits different in the number of stages are provided in the voltage-controlled oscillation circuit 15, and the number of stages of the ring oscillation circuit is controlled by the selection signal SEL, so that the frequency range of the clock signal outputted as the feedback clock signal is widened, which in turn widens the usable (lockable) frequency range of the reference clock signal. For example, the present invention is easily usable as an interface of various DDR memories where frequencies of the reference clock signal are different.

Incidentally, in the above-described embodiment, the outputs of the plural ring oscillation circuits in the voltage-controlled oscillation circuit 15 are selectively outputted by the selector 22 to control the number of stages of the ring oscillation circuit, but another possible configuration may be such that a selector is provided between the current mirror circuit 21 and the ring oscillation circuits to supply the delay control signals PC, NC only to one of the plural ring oscillation circuits (the delay control signals PC, NC are activated), and the operations of the other ring oscillation circuits are halted (the delay control signals PC, NC are deactivated).

Further, in this embodiment, the plural ring oscillation circuits in the voltage-controlled oscillation circuit 15 are constituted by using the inverter circuits, but this configuration is not restrictive, and they can be constituted by using logic gates with inverted outputs outputting an inverted input signal, and may be constituted by using, for example, NAND circuits, NOR circuits, or the like whose one-side ends are fixed.

Further, in this embodiment, the load capacitance circuits 51, 52 are provided only for the plural ring oscillation circuits in the voltage-controlled oscillation circuit 15, but similar load capacitance circuits may be provided for the inverter chain in the delay circuit 16.

Further, all of the above-described embodiments are only one example of embodiments for carrying out the present invention, and should not be interpreted as limiting a technical scope of the present invention. That is, the present invention can be embodied in various forms without departing from the technical spirit of the present invention or essential features thereof.

INDUSTRIAL APPLICABILITY

As described above, according to the present invention, the oscillation circuit is constituted of: the plural independent internal oscillation circuits whose oscillation frequencies are different and are controllable based on the result of the comparison between the reference clock signal and the feedback clock signal by the phase comparing circuit; and the selecting circuit for selectively outputting one of the outputs of the plural internal oscillation circuits as the feedback clock signal, and the oscillation circuit outputs the delay control signal controlling the delay time of the input signal based on the result of the comparison in the phase comparing circuit. Consequently, the output of any of the independent internal oscillation circuits is outputted as the feedback clock signal, which makes it possible to output the feedback clock signal keeping the proper duty ratio even when the operating speed is high, allowing arbitrary adjustment of the delay time of the input signal. Further, when the internal oscillation circuit includes the load capacitance circuits which are connected to the output ends of the logic gates with inverted outputs and whose load capacitance values are variable by utilizing the oxide film capacitance of the MOS transistors as the load capacitance, more delicate control of the delay time than in a conventional art is feasible, allowing high-accuracy adjustment of the delay time.

What is claimed is:

1. A semiconductor device adjusting a delay time before an input signal is outputted after being inputted, the semiconductor device comprising:

a phase comparing circuit comparing phases of a reference clock signal and a feedback clock signal; and
an oscillation circuit outputting the feedback clock signal and a delay control signal which controls the delay time based on a result of the comparison in said phase comparing circuit; and
a delay circuit delaying the input signal by the delay time according to the delay control signal to output the delayed input signal,
wherein said oscillation circuit comprises:
a plurality of independent internal oscillation circuits with different oscillation frequencies, the oscillation frequencies being controllable based on the result of the comparison in said phase comparing circuit; and
a selecting circuit selectively outputting one of outputs of the plural internal oscillation circuits as the feedback clock signal.

2. The semiconductor device according to claim 1, wherein the plural internal oscillation circuits are a plurality of ring oscillation circuits each constituted of an odd number of cascaded logic gates with inverted outputs, the odd number being different depending on each of the ring oscillation circuits.

3. The semiconductor device according to claim 2, wherein the logic gates with the inverted outputs are inverter circuits.

4. The semiconductor device according to claim 3, wherein a power supply voltage supplied to the inverter circuits is controlled based on the result of the comparison in said phase comparing circuit.

5. The semiconductor device according to claim 4,
wherein said oscillation circuit further comprises a signal generating circuit generating the delay control signal based on the result of the comparison in said phase comparing circuit, and
wherein the power supply voltage supplied to the inverter circuits is controlled by the delay control signal generated by the signal generating circuit.

6. The semiconductor device according to claim 1, wherein the selecting circuit receives the outputs of all the internal oscillation circuits and a selection signal relating to selection of the outputs to selectively output the output of the internal oscillation circuit as the feedback clock signal according to the selection signal.

7. The semiconductor device according to claim 2,
wherein each of the internal oscillation circuits comprises a load capacitance circuit which is connected to output ends of the logic gates with the inverted outputs and whose load capacitance value is varied according to a control signal, and
wherein load capacitance in the load capacitance circuit is oxide film capacitance of a MOS transistor.

8. The semiconductor device according to claim 7, wherein each of the internal oscillation circuits has the first load capacitance circuit which is connected to output ends of odd-numbered logic gates with inverted outputs and the second load capacitance circuit which is connected to output ends of even-numbered logic gates with inverted outputs, out of the cascaded logic gates with the inverted outputs.

9. The semiconductor device according to claim 7, wherein the load capacitance circuit is constituted of a plurality of NAND circuits each having one input connected to the output ends of the logic gates with the inverted outputs and the other input supplied with the control signal.

10. The semiconductor device according to claim 9,
wherein the control signal consists of n bits (n is an arbitrary natural number), and
wherein the load capacitance circuit is constituted of ($2^n-1$) pieces of the NAND circuits, and an mth least significant bit of the control signal is supplied to the other inputs of the ($2^{m-1}$) (m is a natural number equal to or smaller than n) pieces of the NAND circuits.

11. The semiconductor device according to claim 1, wherein said delay circuit is constituted of an even number of cascaded logic gates with inverted outputs.

* * * * *